United States Patent
Giusti et al.

(10) Patent No.: US 12,117,605 B2
(45) Date of Patent: Oct. 15, 2024

(54) ANGULAR PIEZOELECTRIC ACTUATOR FOR A MEMS SHUTTER AND MANUFACTURING METHOD THEREOF

(71) Applicant: STMicroelectronics S.r.l., Agrate Brianza (IT)

(72) Inventors: Domenico Giusti, Caponago (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 740 days.

(21) Appl. No.: 17/355,861

(22) Filed: Jun. 23, 2021

(65) Prior Publication Data

US 2021/0405346 A1 Dec. 30, 2021

(30) Foreign Application Priority Data

Jun. 30, 2020 (IT) .................. 102020000015775

(51) Int. Cl.
  *G02B 26/00* (2006.01)
  *G02B 26/04* (2006.01)
  (Continued)

(52) U.S. Cl.
  CPC ........... *G02B 26/04* (2013.01); *H10N 30/057* (2023.02); *H10N 30/2047* (2023.02); *H10N 30/506* (2023.02); *H10N 30/88* (2023.02)

(58) Field of Classification Search
  None
  See application file for complete search history.

(56) References Cited

U.S. PATENT DOCUMENTS

| 2008/0117258 | A1* | 5/2008 | Silverbrook | B41J 2/14427 347/47 |
| 2015/0145374 | A1* | 5/2015 | Xu | G10K 9/122 29/25.35 |
| 2022/0109097 | A1* | 4/2022 | Shabanian | F16K 99/0015 |

FOREIGN PATENT DOCUMENTS

GB  2379746 A  3/2003

OTHER PUBLICATIONS

Sadat, Seid Hossein, et al: "Large-Deflection Spiral-Shaped Micromirror Actuator," Journal of Microelectromechanical Systems, vol. 18, No. 6, Dec. 2009, 11 pages.

(Continued)

*Primary Examiner* — Jennifer D. Carruth
(74) *Attorney, Agent, or Firm* — Crowe & Dunlevy LLC

(57) ABSTRACT

A MEMS actuator includes a main body having a central portion, couplable to a substrate, and a peripheral portion suspended over the substrate when the central portion is coupled to the substrate. The peripheral portion has a deformable structure extending around the central portion, and forming successively arranged membranes. The MEMS actuator includes bearing structures and corresponding piezoelectric actuators. The bearing structures are fixed at their top to the deformable structure and laterally delimit corresponding cavities, each having a lateral opening facing the central portion of the main body and closed at the top by a membrane. A fixed part of the membrane is fixed to the underlying bearing structure and a suspended part is laterally offset with respect to the underlying bearing structure. The piezoelectric actuators are controllable to cause deformation of the corresponding membrane and rotation of the bearing structures around the central portion of the main body.

27 Claims, 14 Drawing Sheets

(51) Int. Cl.
*H10N 30/057* (2023.01)
*H10N 30/20* (2023.01)
*H10N 30/50* (2023.01)
*H10N 30/88* (2023.01)

(56) References Cited

OTHER PUBLICATIONS

IT Search Report and Written Opinion for IT Appl. No. 102020000015775 dated Mar. 10, 2021 (6 pages).
EPO Search Report for family-related EP Appl. No. 21182607.8 dated Nov. 17, 2021 (6 pages).

* cited by examiner

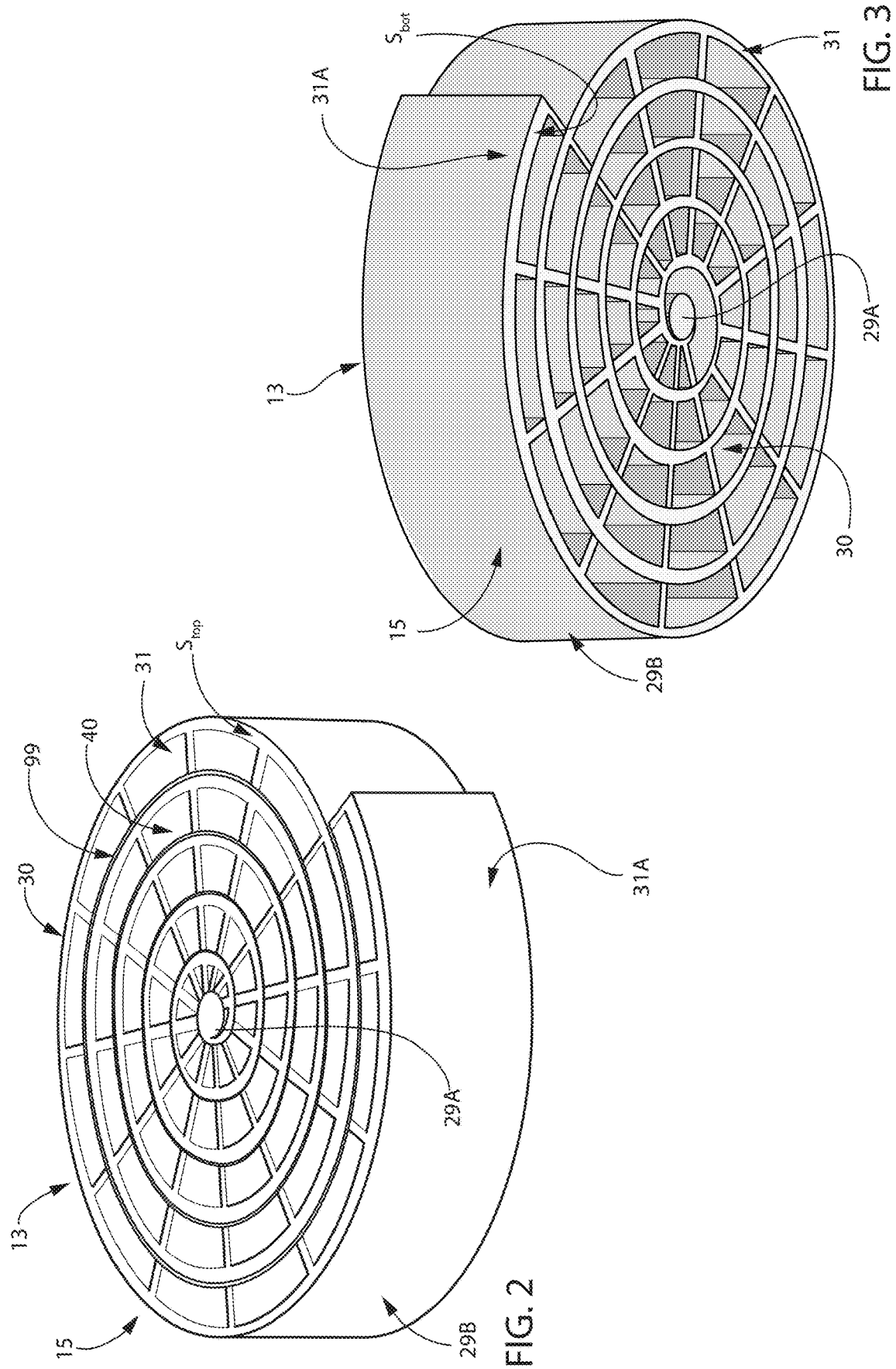

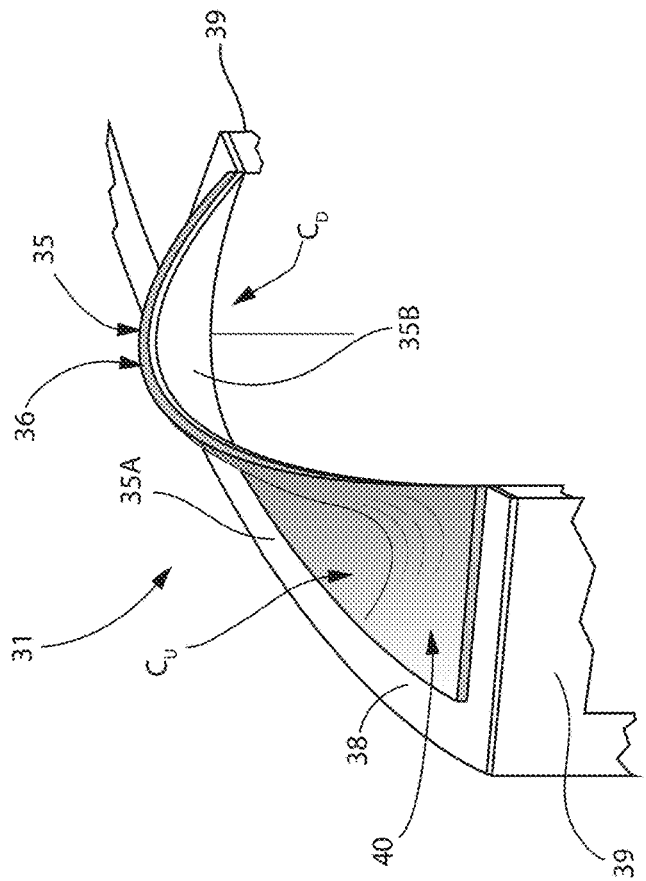
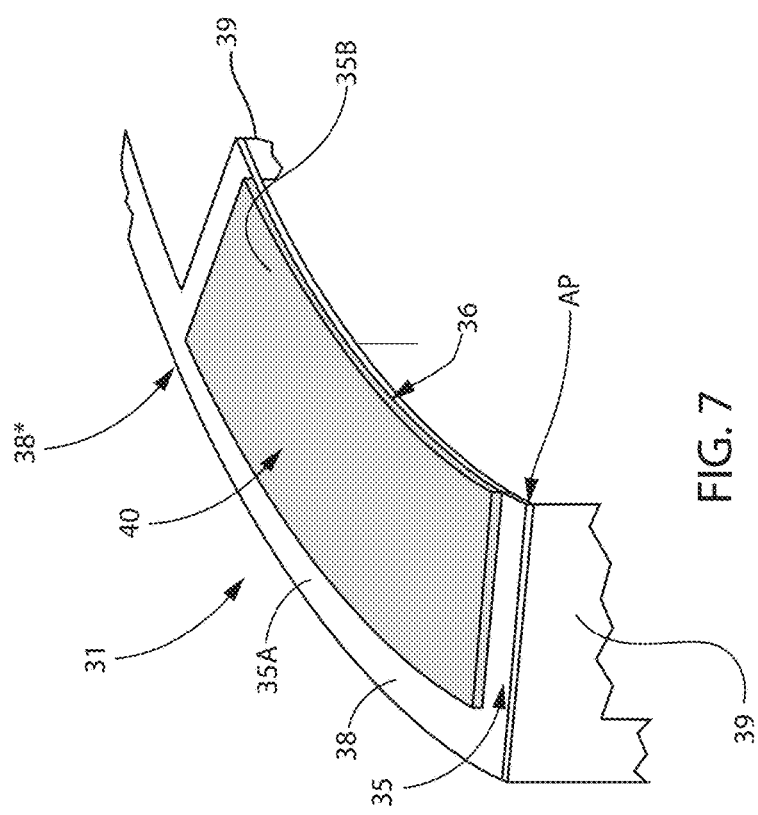
FIG. 7
FIG. 8

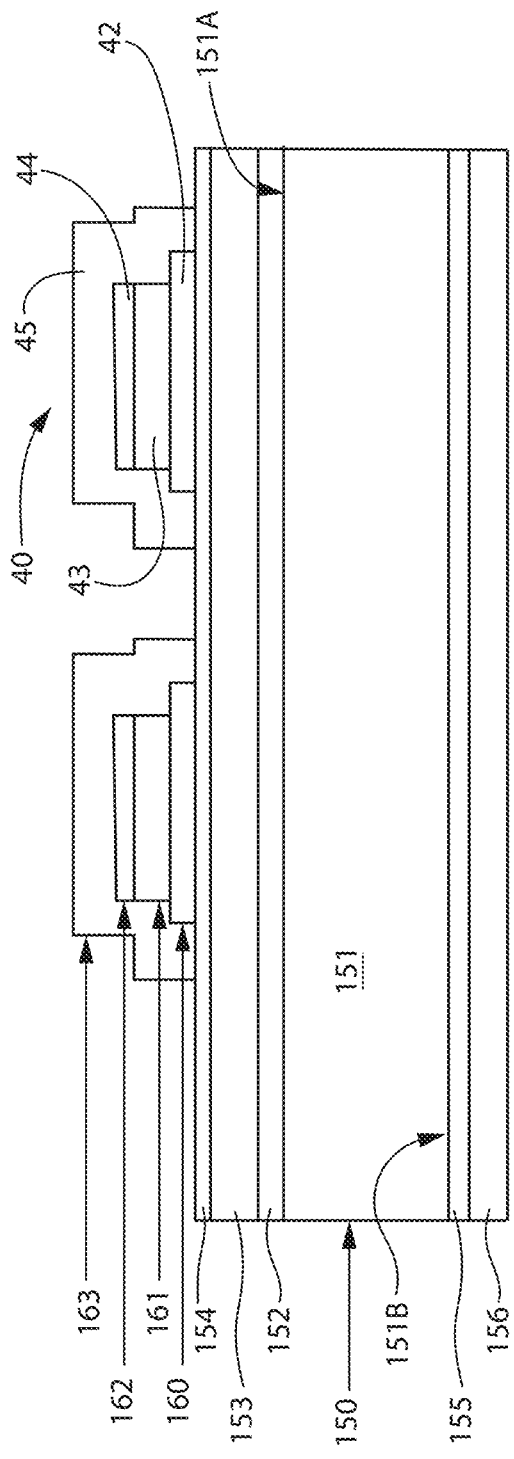

ANGULAR PIEZOELECTRIC ACTUATOR FOR A MEMS SHUTTER AND MANUFACTURING METHOD THEREOF

PRIORITY CLAIM

This application claims the priority benefit of Italian Application for Patent No. 102020000015775, filed on Jun. 30, 2020, the content of which is hereby incorporated by reference in its entirety to the maximum extent allowable by law.

TECHNICAL FIELD

This disclosure relates to an angular piezoelectric actuator for a MEMS (Micro-Electro-Mechanical System) shutter and a method of manufacturing the MEMS shutter.

BACKGROUND

As is known, an angular actuator is a device capable of causing a rotation of a structure connected thereto.

For instance, an angular actuator may be used for controlling a shutter.

A shutter is an apparatus comprising a blocking structure, which lies in a plane and is constrained to the angular actuator, and is coupled to a light beam, such as a laser beam.

Typically, at rest, the blocking structure is arranged so as to intercept the light beam and thus prevent the passage thereof. In use, the angular actuator is controlled so as to cause a rotation, in the plane, of the blocking structure in order to free the path of the light beam. For instance, the blocking structure may be actuated so as to modify the size and intensity of the light beam or to modulate the intensity of the light beam, for example with a frequency on the order of kilohertz.

Angular actuators made with MEMS technology are known, and have an actuation system of an electromagnetic, electrostatic, or bulk piezoelectric type.

However, such known MEMS angular actuators have disadvantages. They are, in fact, characterized by a high energy consumption, on account of high actuation voltages, even of hundreds of volts, especially in the case of electrostatic actuation systems; moreover, in the case of bulk piezoelectric actuation systems, they are characterized by low actuation speed and large dimensions, with thicknesses even of some millimeters. As such, further development of this technology is desired.

SUMMARY

Described herein is a MEMS angular actuator, a manufacturing method therefor, and an optical shutter.

In particular, described herein is a microelectromechanical (MEMS) actuator, including a main body including a central portion couplable to a substrate, and a peripheral portion. The peripheral portion, when said central portion is coupled to said substrate, is suspended over the substrate. The peripheral portion includes a deformable structure that extends around the central portion and forms a plurality of membranes arranged in succession, the peripheral portion having a spiral planar shape when at rest.

The MEMS actuator further includes a plurality of bearing structures, each bearing structure being fixed at its top to the deformable structure and laterally delimiting a corresponding cavity. The corresponding cavity has a lateral opening facing the central portion of the main body and being closed at its top by a corresponding membrane. The corresponding membrane has a fixed part affixed to the underlying bearing structure, and a suspended part, the suspended part being laterally offset with respect to the underlying bearing structure and delimiting said lateral opening of the cavity.

Each bearing structure has a corresponding piezoelectric actuator associated therewith. The piezoelectric actuators are electrically controllable so as to cause deformation of the corresponding membranes, the deformation comprising an upward curving of portions of the suspended parts, the upward curving of the portions of the suspended parts of the membranes causing a rotation of the bearing structures around the central portion of the main body.

A support structure may have a spiral shape and extends underneath the deformable structure. Each bearing structure may include a corresponding portion of the support structure, and a pair of stiffening structures which, at rest, extend from corresponding ends of the corresponding portion of the support structure, along corresponding radial directions, toward the central portion of the main body. The fixed part of each membrane may be fixed to a corresponding pair of stiffening structures and to the corresponding portion of the support structure.

The upward curving of the portions of the suspended parts of the membranes may cause an increase of curvature of each portion of the support structure, with consequent increase of angular extension of the support structure and rototranslation of the stiffening structures, said rototranslation comprising a rotation around the central portion of the main body.

Each stiffening structure may have a first end, the first end being integral with the corresponding portion of support structure and a second end. The suspended part of each membrane may include a respective edge, which extends between the second ends of corresponding stiffening structures and overlies a corresponding lateral opening, which is laterally delimited by the second ends of the corresponding stiffening structures. The upward curving of the portion of the suspended part of each membrane may cause a curving upward of the corresponding edge, with concavity facing downwardly.

The membranes may have a dimension along the radial direction that is angularly invariant.

At least part of the support structure may have a dimension along the radial direction that is angularly invariant.

The deformable structure may have a thickness smaller than a thickness of the stiffening structures and smaller than a thickness of the support structure.

Each piezoelectric actuator may include a piezoelectric region which extends over the suspended part of the corresponding membrane.

BRIEF DESCRIPTION OF THE DRAWINGS

For a better understanding, an embodiment is now described, purely by way of non-limiting example, with reference to the attached drawings, wherein:

FIG. 2 is a schematic perspective view, from above, of a detail of the MEMS angular actuator of FIG. 1;

FIG. 3 is a schematic perspective view, from beneath, of the detail of the MEMS angular actuator of FIG. 2;

FIGS. 7 and 8 are schematic perspective views of a detail of the MEMS angular actuator of FIG. 2, at rest and in use, respectively;

FIGS. 13-18 are schematic cross-sections of the MEMS angular actuator disclosed herein, in successive manufacturing steps.

DETAILED DESCRIPTION

Described hereinbelow is an angular actuator 10 (also hereinafter referred to as actuator 10) made by thin-piezo-electric-film MEMS technology, capable of exerting a torque about a Z axis of a Cartesian reference system having X, Y, and Z axes.

Figure 1:
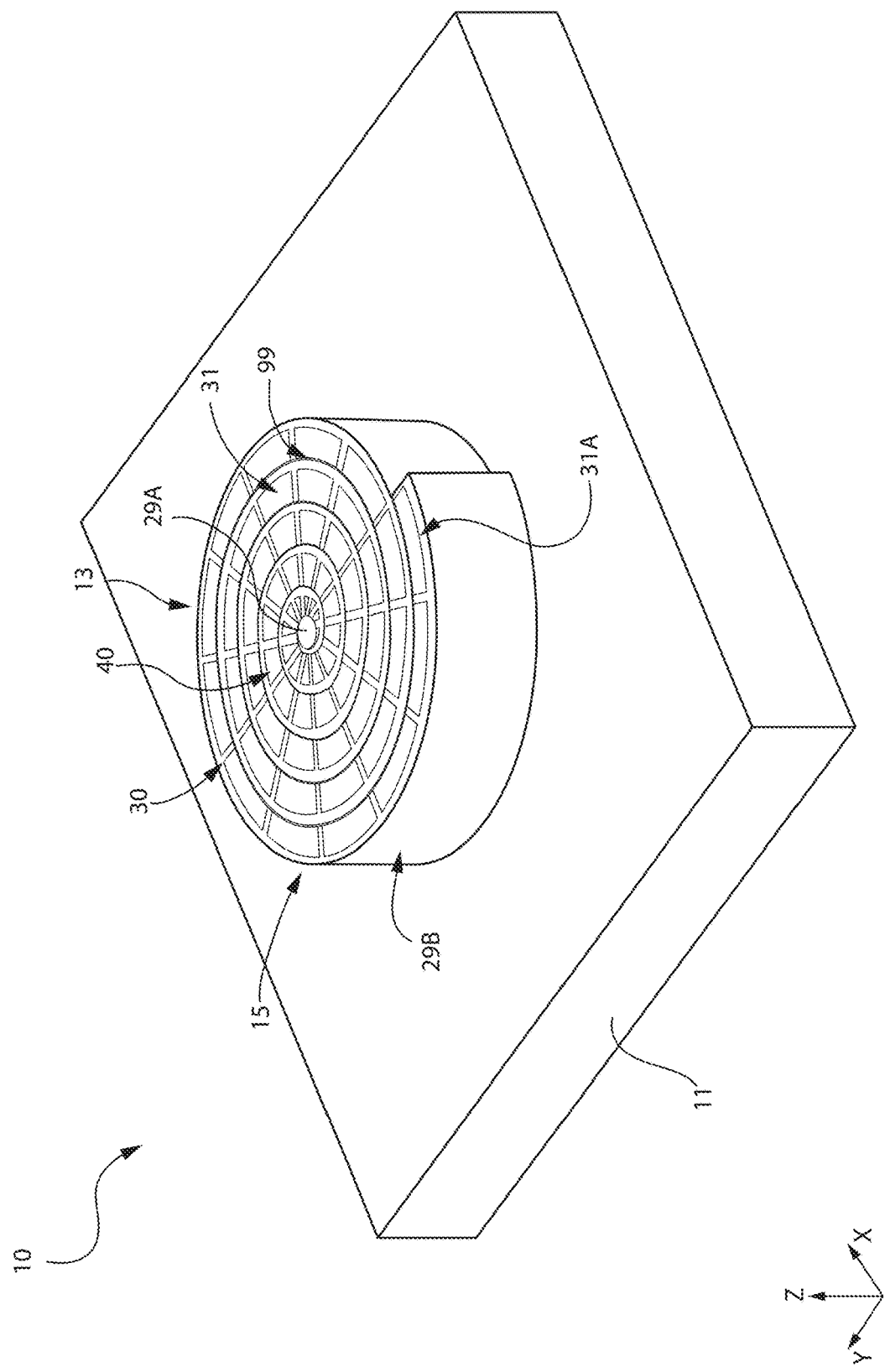
FIG. 1 is a schematic perspective view of the MEMS angular actuator disclosed herein.

As illustrated in FIG. 1, the actuator 10 comprises a substrate 11 of semiconductor material, for example silicon, and a layered structure 13 formed by a stack of layers 17.

Figure 5:
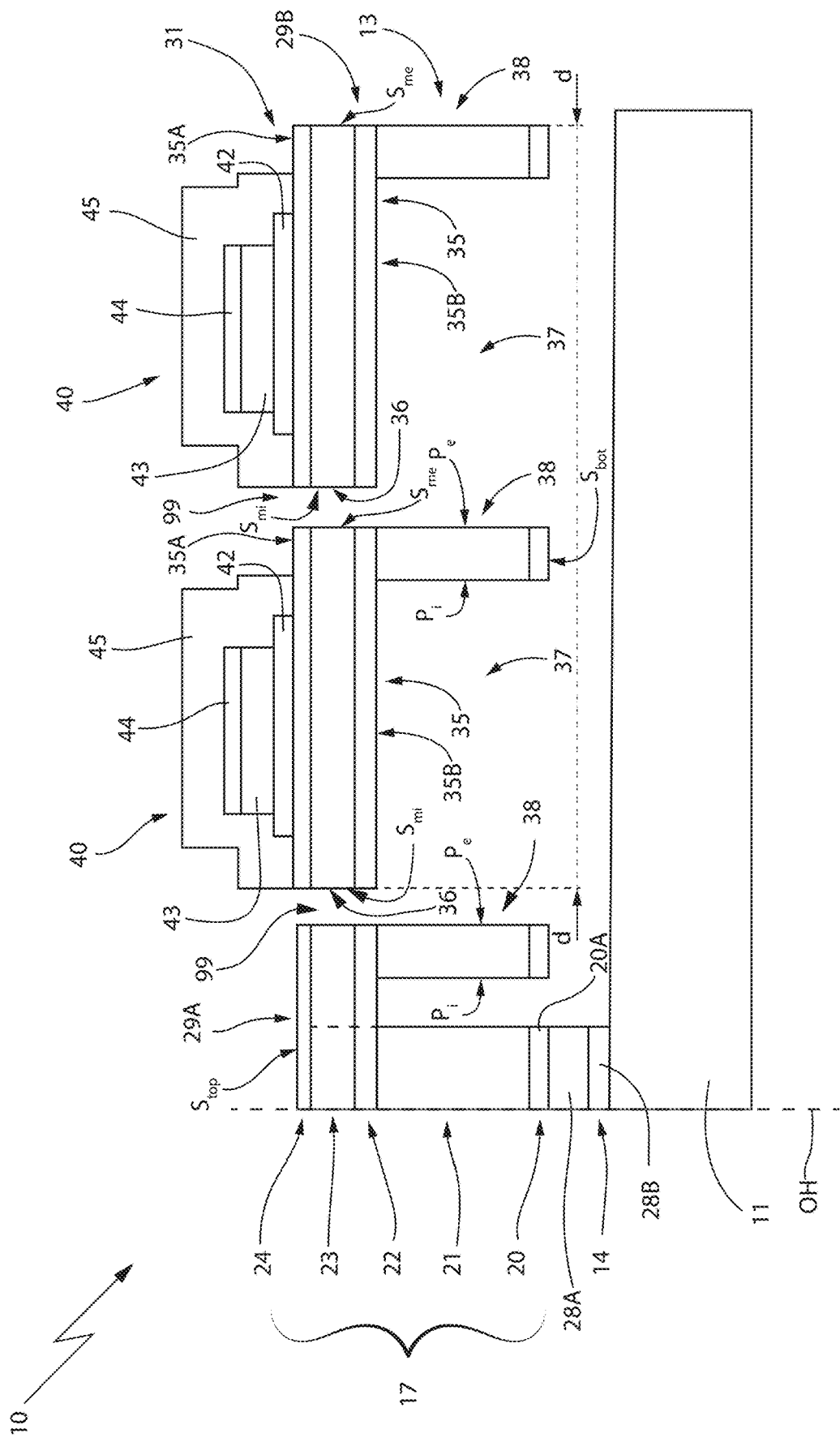
FIG. 5 is a schematic cross-section of the MEMS angular actuator disclosed herein taken along the line of section V-V of FIG. 4.
Figure 6:
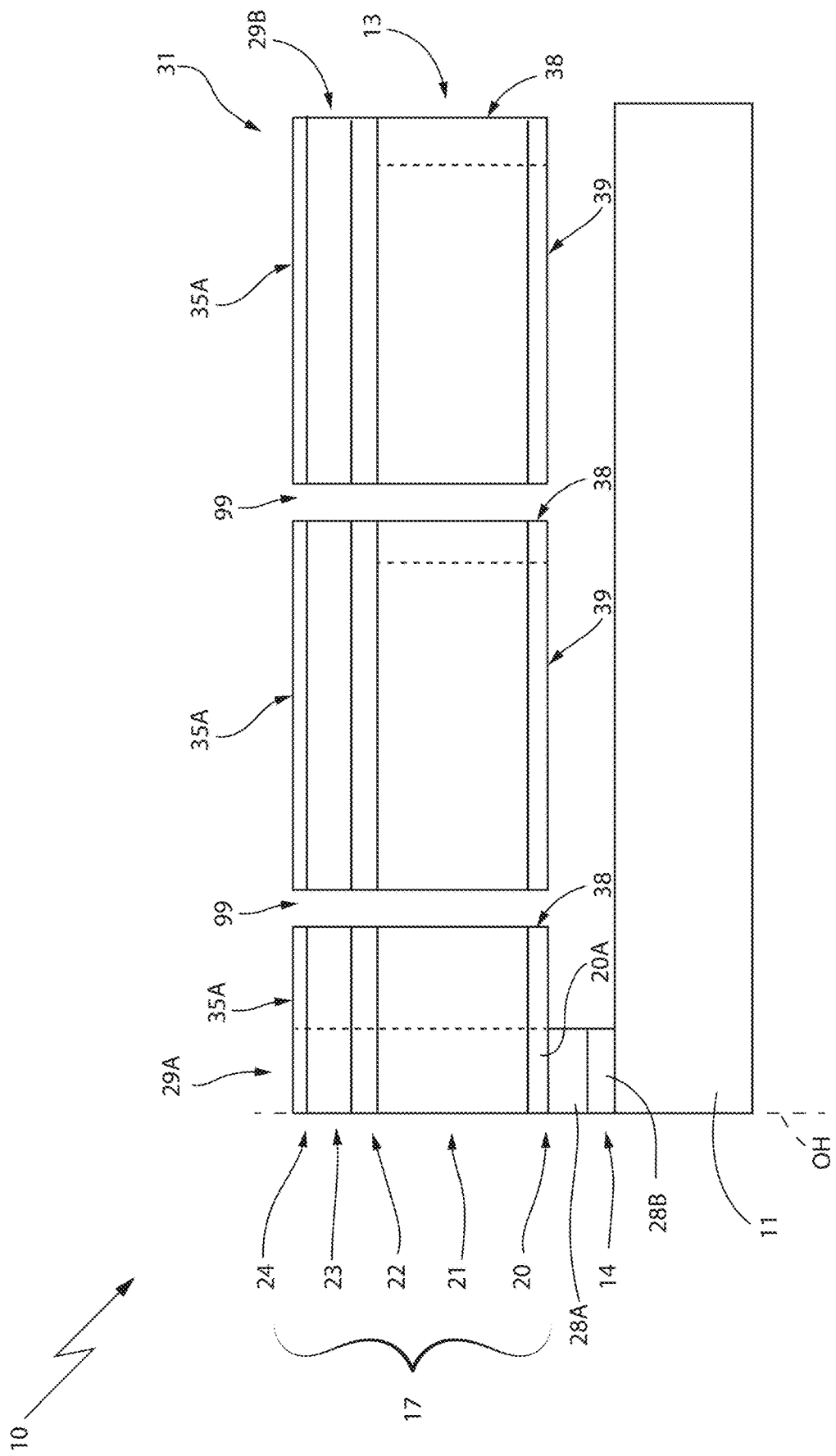
FIG. 6 is a schematic cross-section of the MEMS angular actuator disclosed herein taken along the line of section VI-VI of FIG. 4.

In detail, in this embodiment and as illustrated in FIGS. 5 and 6, the stack of layers 17 is formed by the succession, along the Z axis and from beneath upward, of: a first insulating layer 20, for example of silicon oxide or tetraethyl orthosilicate (TEOS); a structural layer 21, of semiconductor material, for example silicon, having a large thickness, comprised, for example, between 50 µm and 500 µm (e.g., of approximately 300 µm); a second insulating layer 22, for example of silicon oxide or tetraethyl orthosilicate (TEOS); a membrane layer 23 of semiconductor material, for example polysilicon, having a thickness comprised, for example, between 0.2 µm and 50 µm (e.g., of approximately 0.7 µm); and a third insulating layer 24, for example of silicon oxide or tetraethyl orthosilicate (TEOS).

The stack of layers 17 is delimited at the top and at the bottom, respectively, by a top surface $S_{top}$ and a bottom surface $S_{bot}$, which are formed, respectively, by the third insulating layer 24 and the first insulating layer 20 and are parallel to the XY plane.

Figure 4:
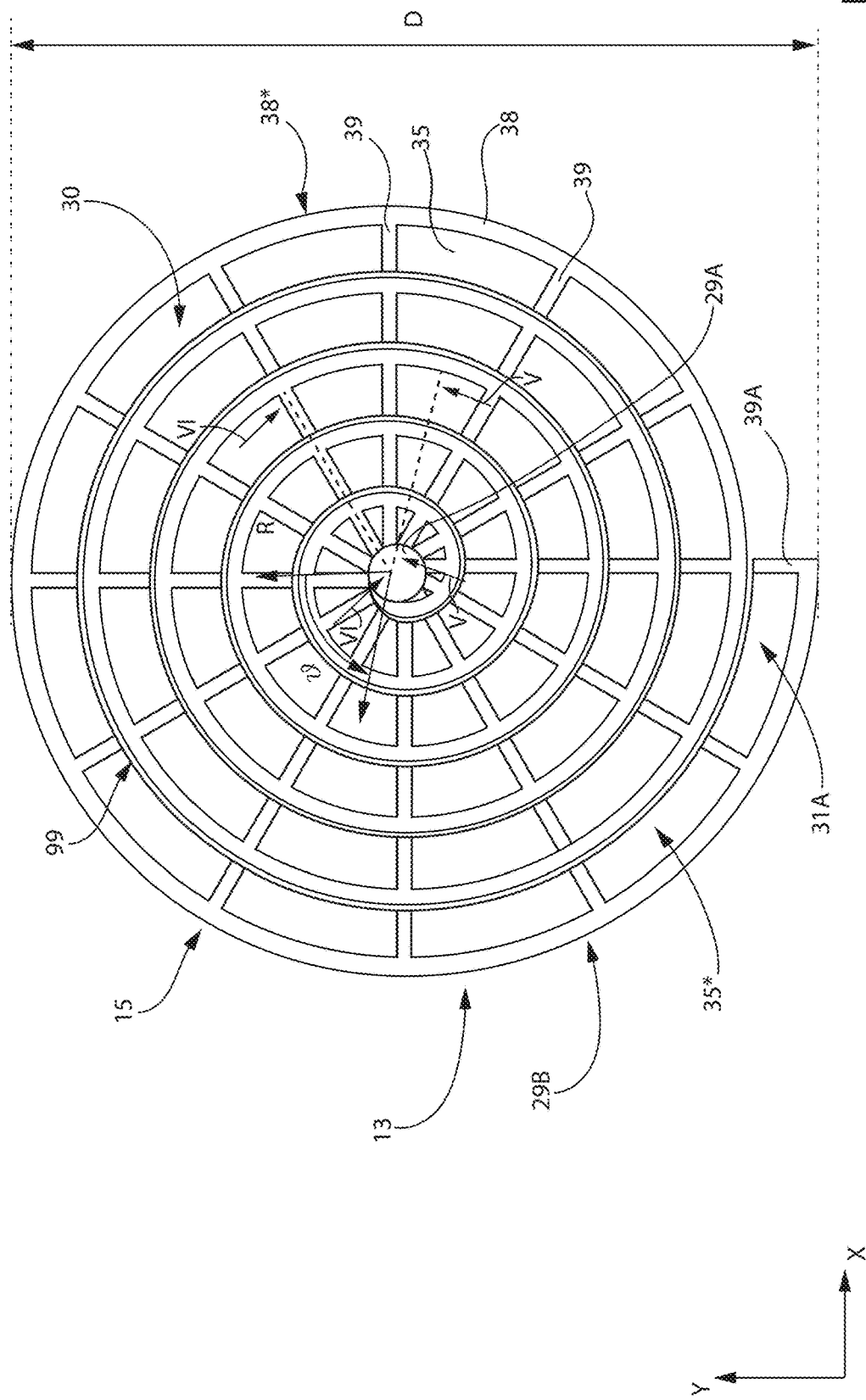
FIG. 4 is a schematic top view of the detail of the MEMS angular actuator of FIG. 2.

As illustrated in FIGS. 2-4, the layered structure 13 is shaped by a gap 99 so as to form a main body 15, which comprises a central portion 29A having an approximately cylindrical shape, with an axis OH parallel to the Z axis, and a peripheral portion 29B, which has a spiral shape and develops around the central portion 29A, and therefore about the axis OH.

As illustrated in FIGS. 5 and 6, the actuator 10 further comprises a pin 14 which extends underneath the bottom surface $S_{bot}$, and in particular underneath the central portion 29A, and has a cylindrical shape, with axis that coincides with the axis OH; moreover, the pin 14 has a first end bonded to the substrate 11 and a second end fixed to the central portion 29A.

In detail, the pin 14 is formed by a first portion 28A of semiconductor material, for example polysilicon, and a second portion 28B of insulating material, such as silicon oxide or tetraethyl orthosilicate (TEOS). The first portion 28A of the pin 14 is arranged underneath a portion of the first insulating layer 20 that forms the central portion 29A, in direct contact therewith; the second portion 28B of the pin 14 is arranged between the first portion 28A and the substrate 11, in direct contact therewith.

In practice, thanks to the presence of the pin 14, the peripheral portion 29B of the main body 15 is suspended over the substrate 11, at a distance therefrom.

As mentioned previously, the peripheral portion 29B of the main body 15 has a spiral shape, which comprises a plurality of windings 30 that extend in a concentric way from and around the central portion 29A, therefore about the axis OH. The main body 15 has, at rest and in a direction parallel to the Y axis, a rest size D. In particular, assuming a cylindrical reference system centered on the axis OH and having a radial coordinate R and an angular coordinate θ, each winding 30 is formed by a corresponding part of the peripheral portion 29B of the main body 15 that has an extension equal to 360°, with respect to the angular coordinate θ.

Moreover, as described hereinafter in greater detail, the windings 30 have, along the radial coordinate R, the same width; in addition, adjacent pairs of windings are set apart from one another by the same distance; in other words, the peripheral portion 29B of the main body 15 forms an Archimedean spiral.

In greater detail, the windings 30 of the peripheral portion 29B of the main body 15 are formed by a support structure 38* and by a plurality of deformable units 31 arranged in succession so as to form a single piece, starting from the central portion 29A, up to a final deformable unit 31A, which is the maximum distance (both in the radial direction and in the angular direction) from the central portion 29A.

Each deformable unit 31 comprises a membrane 35 suspended over a corresponding cavity 37; a respective portion 38 of the support structure 38*; and a pair of stiffening structures 39.

In greater detail, in each deformable unit 31, the membrane 35 is formed by corresponding portions of the second insulating layer 22, the membrane layer 23, and the third insulating layer 24. Moreover, the support structure 38* and the stiffening structures 39 are formed by corresponding portions of the first insulating layer 20 and the structural layer 21.

The cavity 37 is delimited at the top by the membrane 35, is in part delimited laterally by the respective portion 38 of the support structure 38* and by the stiffening structures 39, is open at the bottom in the direction of the underlying substrate 11 and laterally, in the direction of the axis OH, via a lateral opening AP (visible in FIG. 7).

As illustrated in FIG. 5, the support structure 38* is delimited laterally by an inner wall $P_i$, oriented towards the axis OH, and by an outer wall $P_e$, oriented outwardly.

The inner wall $P_i$ and the outer wall $P_e$ wrap around the axis OH and are curved, with a single concavity oriented towards the axis OH. In addition, at each point of the inner wall $P_i$, the plane tangential to the inner wall $P_i$ and passing through the point is parallel to the Z axis; the same consideration applies to the points of the outer wall $P_e$.

To a first approximation, and at rest, the portions 38 of the support structure 38* each have substantially, in top view, the shape of an annulus sector; therefore their sections perpendicular to the Z axis are invariant for translations along the Z axis. Furthermore, to a first approximation, the portions of outer wall $P_e$ and inner wall $P_i$ that delimit a respective portion 38 of the support structure 38* each have a respective single radius of curvature, the radius of curvature of the portion of outer wall $P_e$ being greater than the radius of curvature of the portion of inner wall $P_i$.

The two stiffening structures 39 have the same shape.

In particular, each stiffening structure 39 has the shape of a parallelepiped, which has a first end fixed to a respective end of the respective portion 38 of the support structure 38* (highlighted by a dashed line in FIG. 6) and which extends therefrom, parallel to the direction of the radial coordinate and toward the axis OH, up to a second end. In other words, the second ends of the stiffening structures 39 are arranged at a shorter distance from the axis OH as compared to the corresponding first ends.

The membranes 35 each overlie both the respective portion 38 of the support structure 38* and the respective pair of stiffening structures 39, forming a single piece therewith.

Each membrane 35 comprises a fixed part 35A, fixed to the corresponding underlying portion 38 of the support structure 38* and to the corresponding underlying stiffening structures 39, and a suspended part 35B which overlies the respective cavity 37.

In particular, as also visible in FIG. 7, each membrane 35 has the shape, in top view, of a rectangle having curved long sides, whose two short sides and whose long side that is farther from the axis OH form the fixed part 35A and are fixed, respectively, to the two stiffening structures 39 and to the corresponding portion 38 of the support structure 38*, whereas the long side closer to the axis OH is not constrained and forms an edge 36 that extends between the second ends of the corresponding stiffening structures 39, laterally delimiting the suspended part 35B of the membrane 35 and delimiting at the top the lateral opening AP of the respective cavity 37.

The membranes 35 of the deformable units 31 form a single planar structure 35*, without any discontinuity.

Without this implying any loss of generality, the planar structure 35*, in addition to having a cross-section invariant with respect to translations along the Z axis, has a width, measured along the radial coordinate R, invariant with respect to the angular coordinate θ (and therefore also independent of the winding 30 considered), except for possible variations of width in the proximity of the central portion 29A, i.e., for values of θ lower, for example, than 270°. Moreover, the planar structure 35* is laterally delimited by an inner surface $S_{mi}$, oriented towards the axis OH, and an outer surface $S_{me}$, oriented outwardly. The inner surface $S_{mi}$ and the outer surface $S_{me}$ wrap around the axis OH. In addition, at each point of the inner surface $S_{mi}$, the plane tangential to the inner surface $S_{mi}$ and passing through the point is parallel to the Z axis; the same consideration applies to the points of the outer surface $S_{me}$.

Each membrane 35 is consequently formed by a portion of the planar structure 35*.

In greater detail, the outer wall $P_e$ is vertically aligned with the outer surface $S_{me}$ of the planar structure 35*. In other words, the outer wall $P_e$ shares generatrices with the outer surface $S_{me}$.

In addition, considering any pair formed by a first and a second winding 30 adjacent to one another, wherein the first winding 30 is arranged on the outside of the second winding 30, the portion of outer surface $S_{me}$ of the second winding 30 and the portion of inner surface $S_{mi}$ of the first winding 30 are set apart from one another by a distance d (shown in FIG. 5, for example equal to 145 μm) independent of the angular coordinate θ, and laterally delimit a corresponding portion of the gap 99, which, as mentioned previously, in top view, has a spiral shape and is arranged between pairs of adjacent windings. Furthermore, each cavity 37 is laterally offset outwardly with respect to the portion of gap 99 that delimits the corresponding membrane 35. The cavities 37 are in fluid communication with the gap 99, since they are open laterally towards the axis OH.

The deformable units 31 are arranged in succession, along a spiral profile, so as to form, as explained previously, the windings 30 of the main body 15.

In detail, the pair of stiffening structures 39 of the final deformable unit 31A comprise a final stiffening structure 39A, having both angular and radial maximum distances with respect to the axis OH.

Moreover, as shown in FIG. 6, and without this implying any loss of generality, the stiffening structures 39 have, in the radial direction, the same width, which, without this implying any loss of generality, is equal to the width of the membranes 35 and thus represents the width of the windings 30.

A number of first units (e.g., nine in this embodiment) of the succession of deformable units 31, arranged from the central portion 29A of the main body 15, may have shape and dimensions different from the remaining deformable units 31.

In particular, in this embodiment, the membrane 35 and the stiffening structures 39 of the first units of the succession of deformable units 31 have a smaller width with respect to the remaining deformable units 31.

In addition, pairs of adjacent deformable units 31 share a corresponding stiffening structure 39.

Again with reference to the stiffening structures 39, and without this implying any loss of generality, at rest they are distributed angularly along twelve radial directions, angularly equally spaced, referred to hereinafter as the shared radial directions. In other words, except for the aforementioned first deformable units 31, the stiffening structures 39 of each winding 30 each extend along a respective shared radial direction. Consequently, the stiffening structures 39 may be grouped into groups, each group being associated to a corresponding shared radial direction and including, for each winding 30, the stiffening structure 39 of the winding 30 that extends in the corresponding shared radial direction.

The actuator 10 further comprises a plurality of actuation elements 40, each formed by a stack comprising a bottom electrode 42 of metal material, for example platinum, an actuation region 43 of piezoelectric material (for example lead zirconate titanate (PZT), $BaTiO_3$, KNN (sodium and potassium niobate), $PbTiO_2$, or $PbNb_2O_6$ and having a thickness comprised between 1 μm and 3 μm, in particular of 2 μm) and a top electrode 44 of metal material, for example of a titanium-tungsten alloy; the actuation region 43 is arranged, in direct contact, between the bottom electrode 42 and the top electrode 44.

Each actuation element 40 is arranged on a respective deformable unit 31, and in particular on the portion of the third insulating layer 24 that forms the corresponding membrane 35 so that the respective bottom electrode 42 contacts the portion of third insulating layer 24. The actuation element 40 and the corresponding cavity 37 are therefore arranged on opposite sides of the corresponding membrane 35.

In detail, without this implying any loss of generality, each actuation element 40 overlies the suspended part 35B of the respective membrane 35.

Alternatively, embodiments (not illustrated) are possible wherein the actuation elements 40 also overlie portions of the fixed part 35A of the respective membrane 35.

In greater detail, in this embodiment, part of the deformable units 31 supports a corresponding actuation element 40. In particular, the aforementioned first units of the succession of deformable units 31 lack the corresponding actuation elements 40. However, embodiments are possible wherein all the deformable units 31 support respective actuation elements 40.

Each actuation element 40 is further coated by a passivation region 45 of insulating material, for example aluminum nitride, silicon nitride, undoped silicon glass (USG), hafnium oxide ($HfO_2$), or dry polymeric film.

Alternatively, the passivation region 45 may be formed by the superposition of a plurality of insulating layers.

In addition, the top electrodes 44 of the plurality of actuation elements 40 are connected together through a respective metal track, here not visible, which also enables the connection to contact pads, not visible, for the electrical connection to an external electrical biasing circuit. Likewise, the bottom electrodes 42 of the plurality of actuation elements 40 are connected together through a respective metal track (here not visible), which also enables the connection to contact pads for the electrical connection to a suitable potential, for example to ground.

For instance, contact pads may be arranged on the central portion 29A of the main body 15.

In use, a bias voltage is applied between the top electrode 44 and the bottom electrode 42 of each actuation element 40. In particular, the bias voltage may be a D.C. voltage or an A.C. voltage, according to the desired application.

The bias voltage causes, in each actuation element 40, a deformation of the piezoelectric region 43; consequently, each membrane 35, integral with respect to a respective actuation element 40, undergoes a deformation.

In particular, as may be seen in FIG. 8 (wherein the values of deformation have been amplified by a factor of one hundred for better clarity), starting from the portion of fixed part 35A that overlies the corresponding portion 38 of the support structure 38* and moving along the radial direction toward the axis OH, the following may be observed. The suspended part 35B of the membrane 35 initially curves toward the cavity 37, slightly below the corresponding rest position, so as to form a first concavity $C_U$ facing upward, and subsequently curves so as to rise markedly above the corresponding rest position, therefore in the direction opposite to the cavity 37, so as to form a second concavity $C_D$ facing downwardly; in addition, the edge 36 curves and assumes a profile having a respective concavity, facing the underlying cavity 37.

Figure 9:
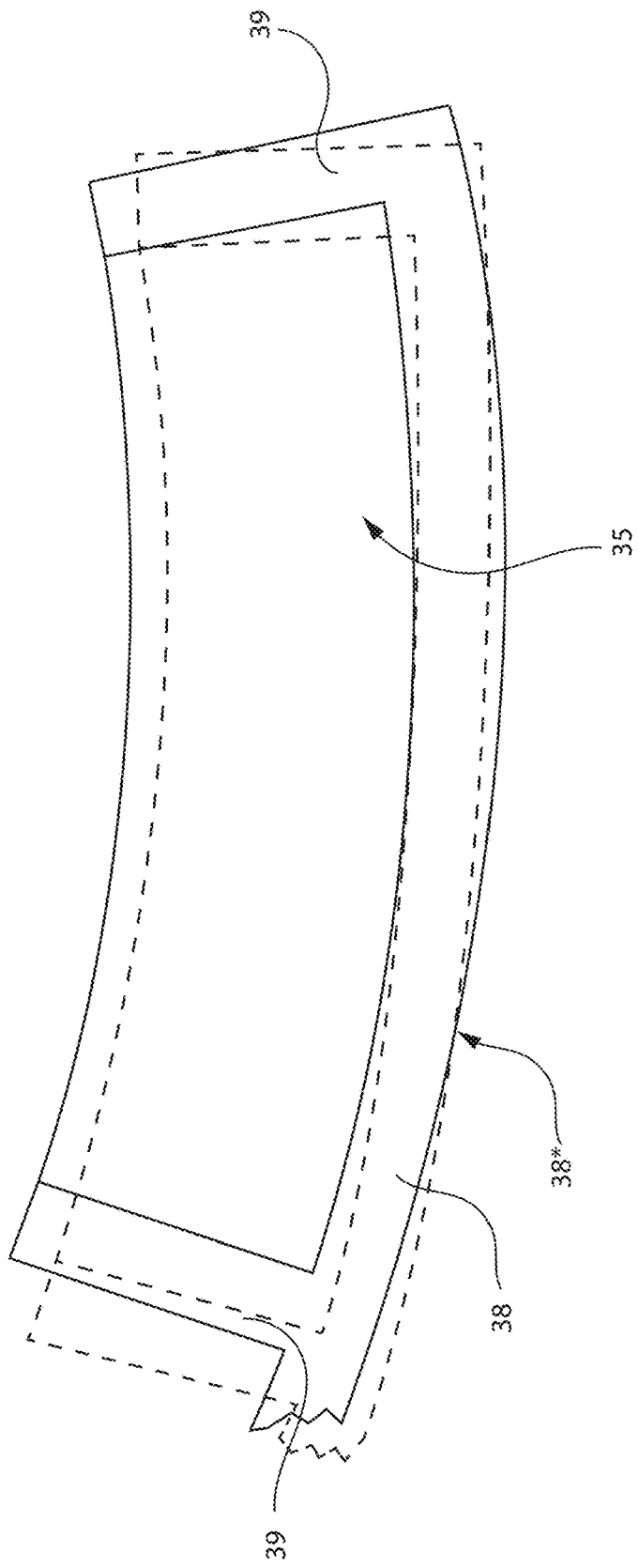
FIG. 9 is a schematic top view of the detail of FIG. 8, wherein the rest position is identified by a dashed line.

In detail, as may be seen in plan in FIG. 9, wherein the rest position is highlighted by a dashed line and the deformed position by a solid line, the deformation of the membrane 35 is such as to cause a rototranslation, substantially in a direction parallel to the XY plane, of the respective stiffening structures 39 and of the respective portion 38 of the support structure 38*, the latter also being subject to a deformation.

In greater detail, the stiffening structures 39 rotate, each about its own axis parallel to the Z axis, so that the second ends of the stiffening structures 39 of each deformable unit 31 move closer to each other; to a first approximation, such rotation is negligible. Furthermore, the stiffening structures 39 of each deformable unit 31 translate toward the central portion 29A of the main body 15. In addition, the stiffening structures 39 of each deformable unit 31 rotate, integrally to one another, around the central portion 29A of the central body 15, in the direction opposite to the winding direction of the peripheral portion 29B, the winding direction of the peripheral portion 29B being considered as starting from the final deformable unit 31A and in the direction of the central portion 29A.

The deformation of each portion 38 of the support structure 38* is such that the curvature radiuses of the portions of the inner wall $P_i$ and of the outer wall $P_e$ that delimit each portion 38 of the support structure 38* decrease as compared to the rest position. In other words, each portion 38 of the support structure 38* increases, locally, its curvature, with a consequent increase of the angular extension of the support structure 38*.

Each deformable unit 31 thus undergoes a rotation, about the axis OH, the extent of such rotation increasing as the distance of the deformable unit 31 from the central portion 29A increases; consequently, the final deformable unit 31A undergoes the rotation having maximum extent.

In particular, the final stiffening structure 39A undergoes a maximum rotation, about the axis OH, with respect to the rest position.

Moreover, the main body 15 undergoes a compression, parallel to the XY plane, so that the main body 15 assumes a work size D*, taken parallel to the Y axis, smaller than the rest size D.

Figure 10:
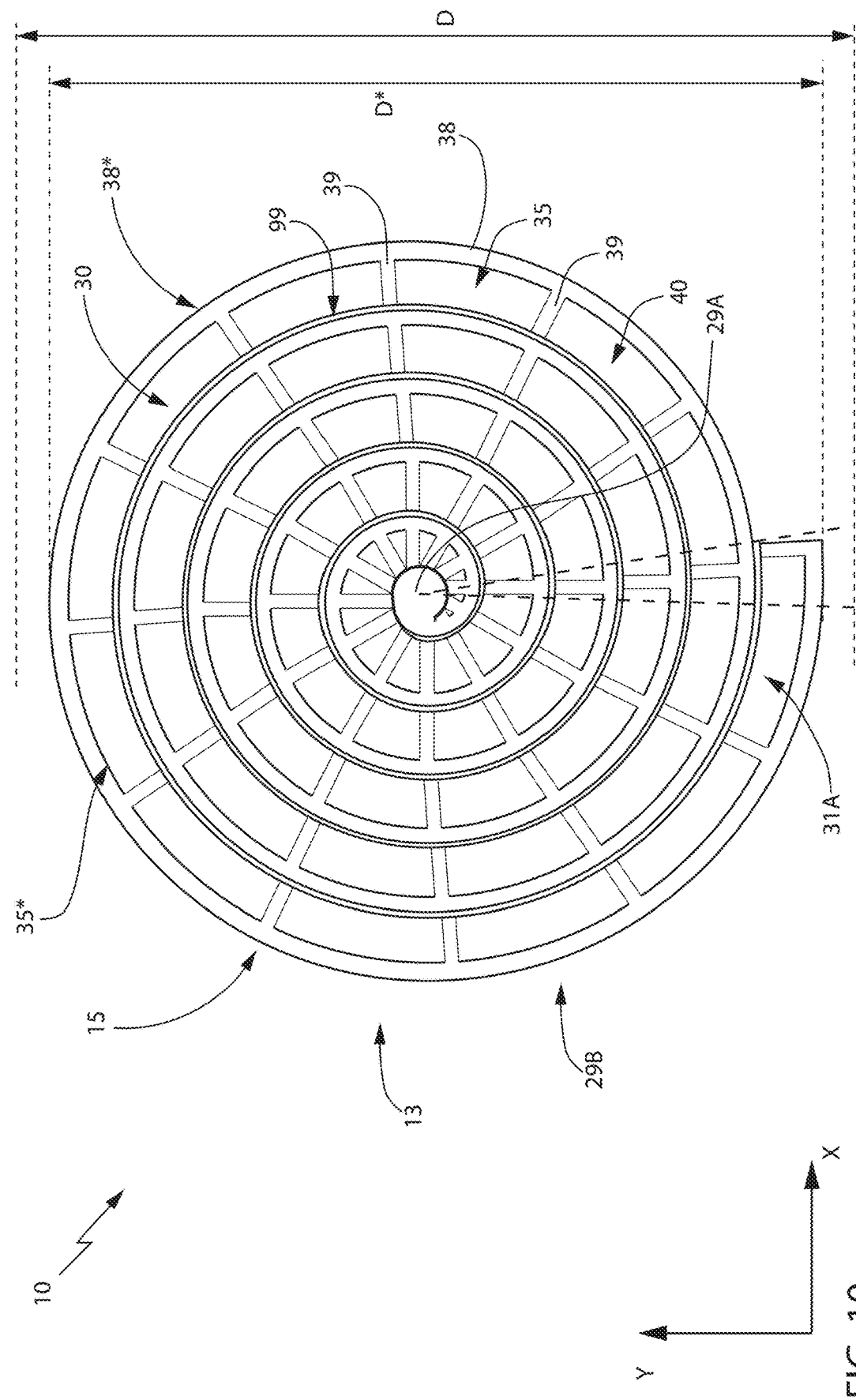
FIG. 10 is a schematic top view of the detail of FIG. 4, in use, wherein the rotation with respect to the rest position is identified by a dashed line.

In particular, the final stiffening structure 39A may undergo a rotation, about the axis OH, by as much as 8° (as illustrated in FIG. 10 by a dashed line with respect to the rest position), given a bias voltage of 40 V applied to the actuation elements 40.

In addition, the main body 15, and in particular the final deformable unit 31A, undergoes a small out-of-plane displacement, parallel to the Z axis. In this embodiment, the out-of-plane displacement of the final stiffening structure 39A may be approximately 0.2% of its own displacement parallel to the XY plane, as verified by simulations. In detail, such reduced out-of-plane displacement is obtained thanks to the large thickness of the support structure 38* and of the stiffening structures 39 with respect to the thickness of each membrane 35.

Figure 11:
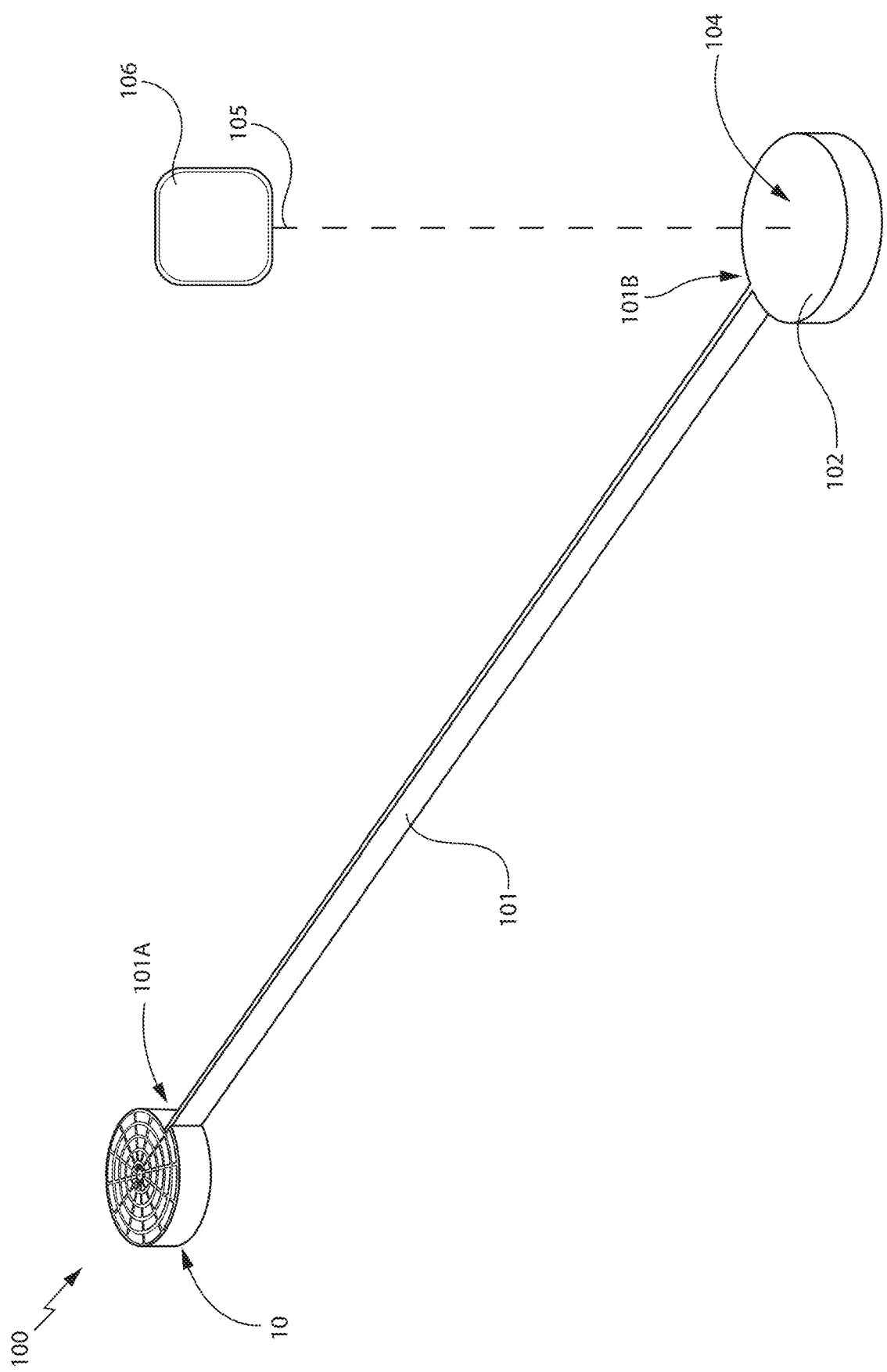
FIG. 11 is a simplified perspective view of an optical shutter incorporating the MEMS angular actuator disclosed herein, at rest.

The actuator 10 may be used in an optical shutter 100, as shown in FIG. 11.

The optical shutter 100 comprises, in addition to the actuator 10, an arm 101 and a blocking structure 102.

The arm 101 forms a single piece with the layered structure 13 and the blocking structure 102 forms a single piece with the arm 101. The arm 101 and the blocking structure 102 are therefore formed by corresponding portions of the stack of layers 17.

In detail, the arm 101 has the shape of a parallelepiped having a thickness, along the Z axis, equal to the thickness of the stack of layers 17 and a horizontal extension, parallel to the XY plane, that is relatively high, for example of the order of millimeters.

The blocking structure 102 here has a cylindrical shape, for example with a diameter of 1 mm and a thickness, parallel to the Z axis, equal to the thickness of the stack of layers 17.

The blocking structure 102 further comprises a top surface 104 coated with a material that absorbs or reflects electromagnetic radiation, such as a metal, for example gold or aluminum.

The arm 101 is constrained, in this embodiment, at a first end 101A, to the final stiffening structure 39A and to the portion 38 of the support structure 38* of the final deformable element 31A; moreover, a second end 101B of the arm 101 is fixed to a portion of the lateral surface of the blocking structure 102.

The optical shutter 100 is arranged along an optical path of a light beam 105, for example a laser beam, generated by an optical source 106.

Without this implying any loss of generality, the optical shutter 100 is arranged so that, at rest, the blocking structure 102 intercepts the light beam 105, completely blocking the optical path. In particular, the light beam 105 may be completely reflected or absorbed by the top surface 104 of the blocking structure 102.

In use, the bias voltage may cause a rotation of the actuator 10, as previously discussed.

Figure 12:
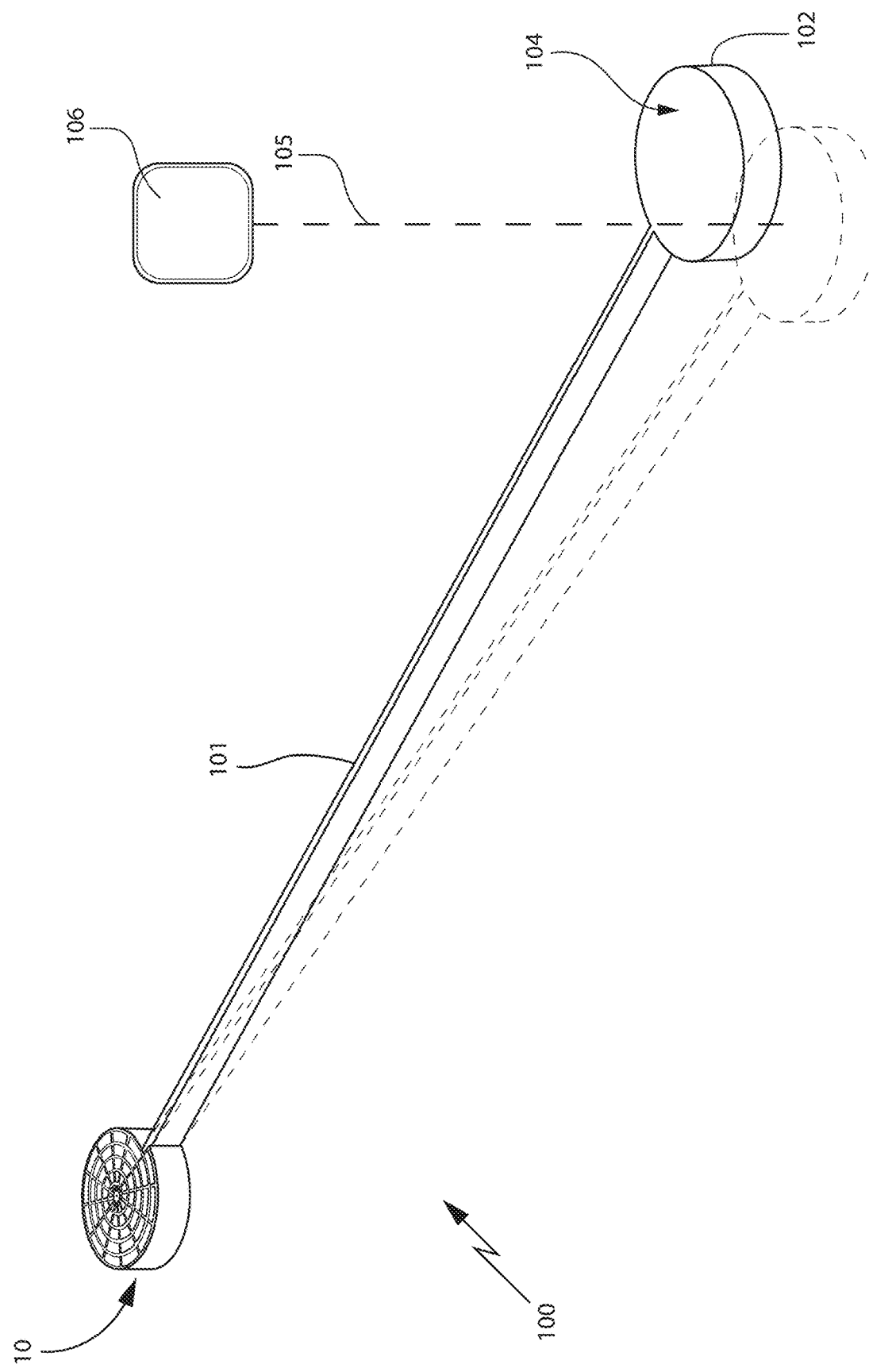
FIG. 12 is a simplified perspective view of the optical shutter of FIG. 11, in use.

Consequently, as shown in FIG. 12, the blocking structure 102 moves with respect to the rest position (highlighted with a dashed line in FIG. 12).

In particular, the blocking structure 102 undergoes a rotation, the rotation having an arc with a linear length proportional to the rotation angle of the final stiffening structure 39A and to the length of the arm 101.

Therefore, the blocking structure 102 frees the optical path of the light beam 105.

The bias voltage may be applied so as to free the optical path of the light beam 105 completely or partially, for example to modify the size and the intensity of the light beam 105.

Alternatively, the bias voltage may have a frequency component that enables modulation, in time, of the intensity of the light beam 105.

Advantageously, the actuator 10 allows obtainment of an optical shutter that has small dimensions, operates at low bias voltages, is efficient from the power consumption standpoint and has a small out-of-plane displacement of the blocking structure 102.

Described hereinafter is a method for manufacturing the actuator 10 of FIG. 1. In particular, for clarity, FIGS. 13-18 show manufacturing steps regarding the cross-section taken along the line of section V-V.

Figure 13:
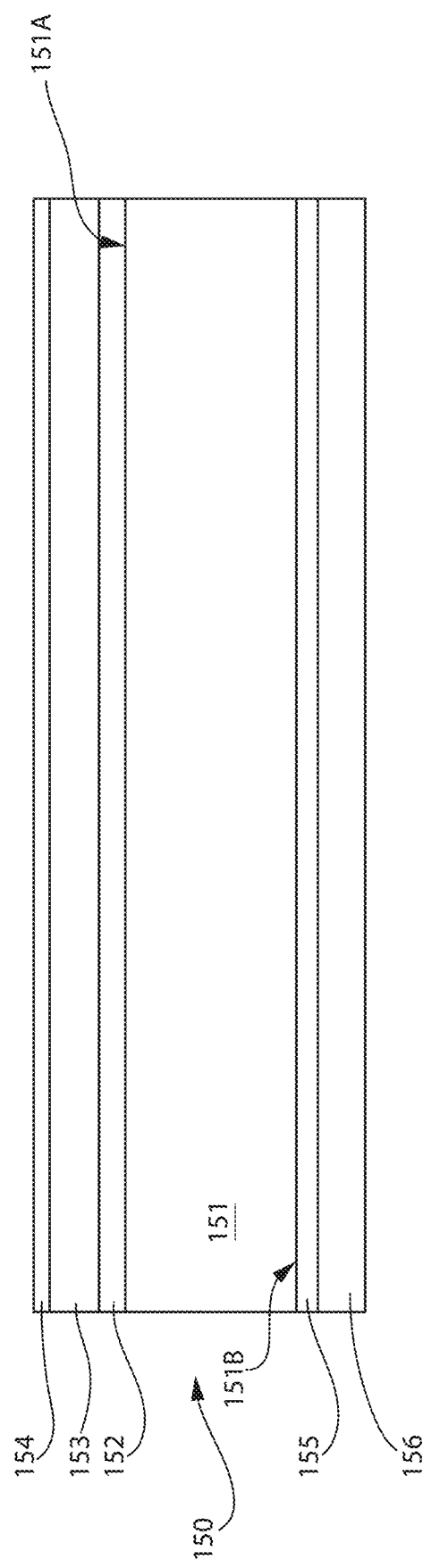

FIG. 13 shows a cross-section of a wafer 150 that has already undergone first manufacturing steps. In detail, the wafer 150 comprises a work substrate 151 (intended to form the structural layer 21 of the stack of layers 17) of semiconductor material, for example silicon, having a first surface 151A and a second surface 151B. The work substrate 151 has already undergone grinding and polishing, for example through chemical-mechanical polishing (CMP), so to obtain a thickness of, for example, 300 μm.

A first dielectric layer 152 (intended to form the second insulating layer 22 of the stack of layers 17), for example of deposited tetraethyl orthosilicate (TEOS) and having a thickness of, for example, at least 1 μm, here 1 μm, extends over the first surface 151A of the work substrate 151.

A passive layer 153 (intended to form the membrane layer 22 of the stack of layers 17) of semiconductor material, for example polysilicon and here having a thickness of 700 nm, extends over the first dielectric layer 152.

A second dielectric layer 154 (intended to form the third insulating layer 24 of the stack of layers 17), for example of deposited TEOS and having a thickness of, for example, 0.5 μm, extends over the passive layer 153.

A first patterning layer 155 (intended to form the first insulating layer 20 of the stack of layers 17), for example of TEOS and having a thickness of, for example, 1 μm, extends over the second surface 151B of the work substrate 151; a bonding layer 156 of semiconductor material, for example polysilicon, and having a thickness of, for example, 50 μm extends underneath the first patterning layer 155, in direct contact therewith.

Next, referring to FIG. 14, a first metal layer 160, for example of platinum, is deposited on the second dielectric layer 154; an actuation layer 161 of piezoelectric material, for example titanium lead-zirconate (PZT), $BaTiO_3$, KNN (sodium and potassium niobate), $PbTiO_2$, or $PbNb_2O_6$ and having a thickness comprised between 1 μm and 3 μm, in particular of 2 μm, is deposited on the first metal layer 160; and a second metal layer 162, for example of a tungsten-titanium alloy, is deposited on the actuation layer 161, forming a stack of actuation layers.

The stack of actuation layers thus obtained is defined by lithographic steps and selective chemical etching so as to form the plurality of actuation elements 40.

In particular, for each actuation element 40, the first metal layer 160 forms the bottom electrode 42, the actuation layer 161 forms the actuation region 43, and the second metal layer 162 forms the top electrode 44.

In addition, the first metal layer 160 also forms a respective metal track, here not illustrated, for the mutual electrical connection and the electrical connection with respective contact pads of each bottom electrode 42 of the actuation elements 40.

In addition, a passivation layer 163, formed of insulating material such as aluminum nitride, silicon nitride, undoped silicon glass (USG), hafnium oxide ($HfO_2$), or dry polymeric film, is deposited so as to cover completely and surround the actuation elements 40 and is defined lithographically so as to form, for each actuation element 40, the passivation region 45.

Next, in a way not illustrated, a via is formed in each passivation region 45, and a further metal layer is deposited on the actuation elements 40 and defined so as to form a respective metal track, here not illustrated, for mutual electrical connection and electrical connection with respective contact pads of each top electrode 44.

As illustrated in FIG. 15, the wafer 150 then undergoes a sequence of selective chemical etchings from the second dielectric layer 154 and as far as the first surface 151A of the work substrate 151 so as to form a trench 165 and expose a part of the work substrate 151. The trench 165 extends, along the Z axis, through the second dielectric layer 154, the passive layer 153 and the first dielectric layer 152, as far as the first surface 151A of the work substrate 151; in a top view, the trench 165 has a spiral shape and is designed to form the gap 99. In particular, as may be seen in FIG. 15, the trench 165 is laterally offset with respect to each actuation element 40.

Figure 16:
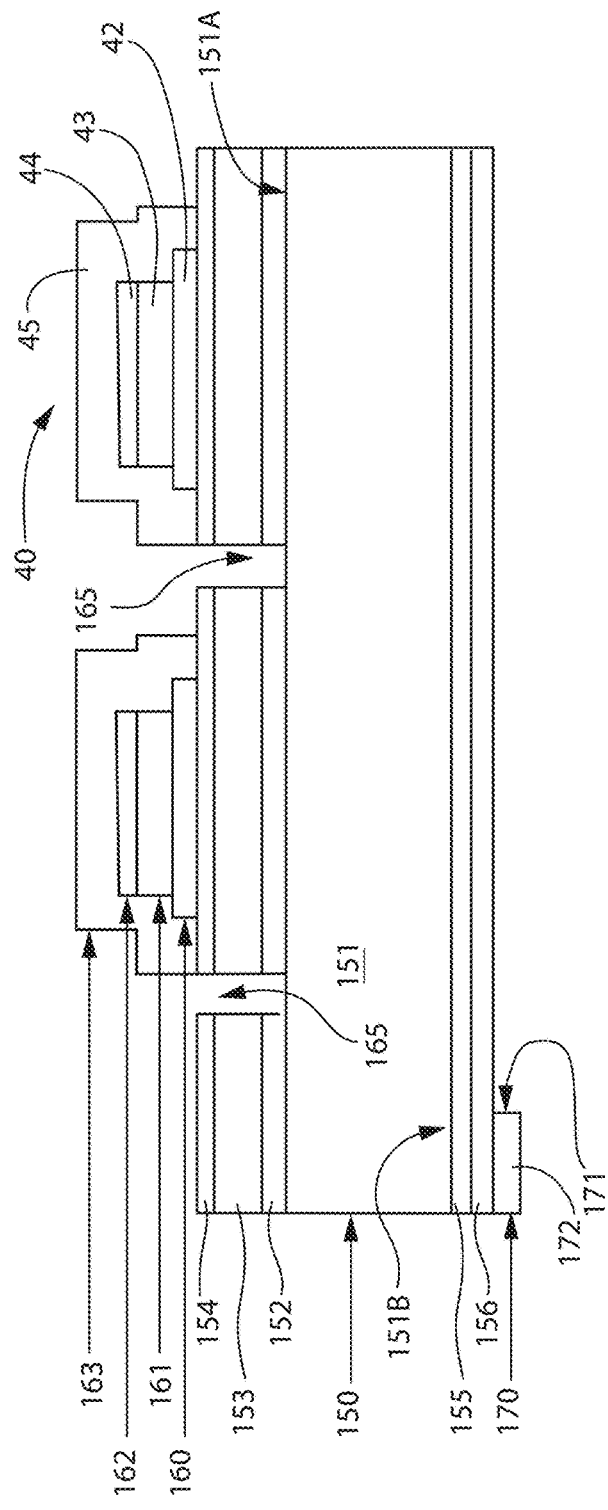

Next, as illustrated in FIG. 16, the bond layer 156 undergoes grinding and chemical-mechanical polishing to obtain a thickness of, for example, 4 μm.

A second patterning layer 170 is then deposited on the bond layer 156 and is defined lithographically so as to form a window 171. The window 171 extends through the patterning layer 170 so as to expose part of the bond layer 156. From the second patterning layer 170, a portion 172 remains, which is shaped approximately like a cylinder having the axis OH and is intended to form the second portion 28B of the pin 14.

Figure 17:
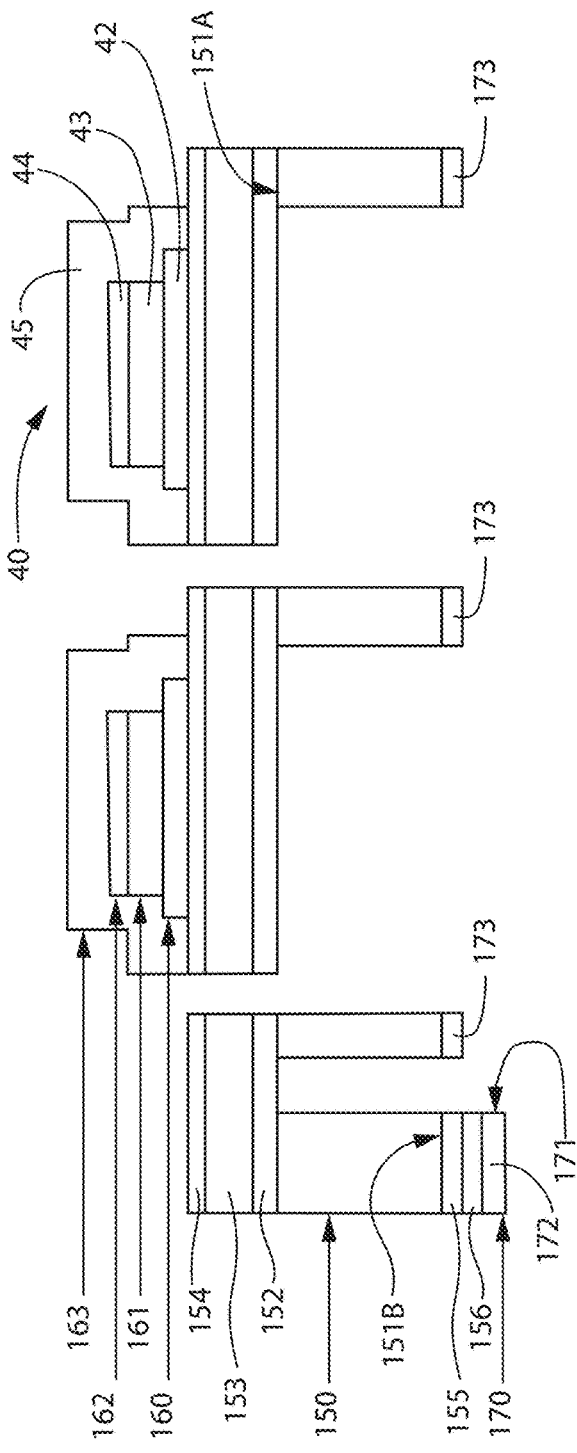

Next, as shown in FIG. 17, selective chemical etchings are performed on the second surface 151B of the work substrate 151, by using the portion 172 of the second patterning layer 170, so as to form the cavities 37 and the main body 15.

In detail, the window 171 is used to selectively remove part of the bonding layer 156, of which a portion remains, arranged on top of the portion 172 of the second insulating layer and intended to form the first portion 28A of the pin 14.

Next, the first patterning layer 155 is defined lithographically so as to form a portion arranged on top of the remaining portion of the bonding layer 156 (intended to form the second portion 28B of the pin 14) and a plurality of portions 173 laterally offset so as to leave exposed portions of the second surface 151B of the work substrate 151. Next, using the portion 172 of the second patterning layer 170 and the plurality of portions 173 of the first patterning layer 155 as mask, portions of the work substrate 151 are removed selectively from the exposed portions of the second surface 151B and as far as the first surface 151A of the work substrate 151 so as to form the corresponding cavities 37 which communicate with the trench 165.

In this way, in addition to the cavity 37, the pin 14, the support structure 38*, the membranes 35 and the stiffening structures 39 of each deformable unit 31 are formed.

Figure 18:
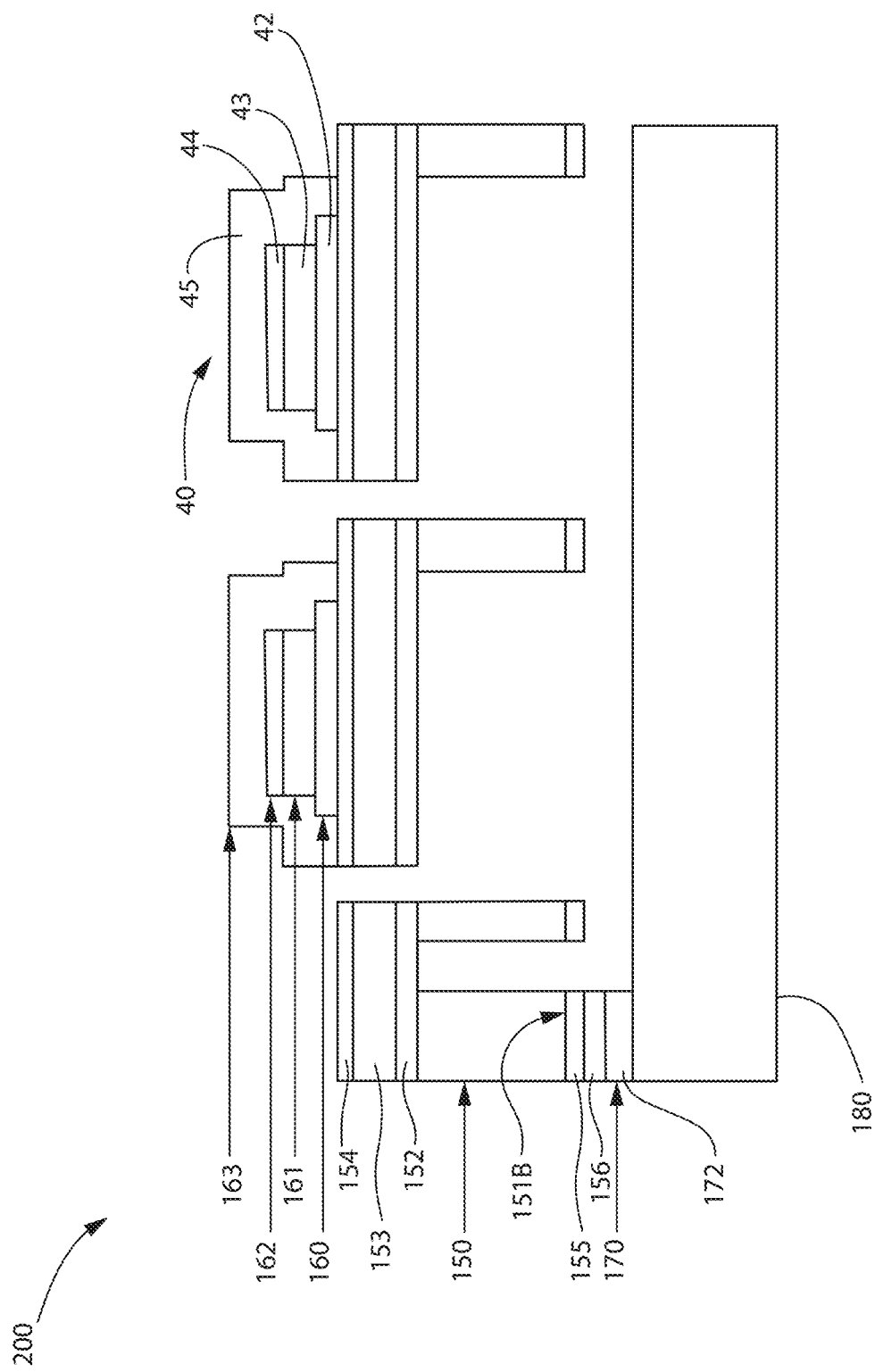

Next, as shown in FIG. 18, the portion 172 of the second patterning layer 170 is bonded to a support wafer 180 of semiconductor material, for example silicon.

Finally, in a way not illustrated, the group 200 formed by the wafer 150 and the support wafer 180 are diced so that, after packaging and electrical connection operations, each die forms the actuator 10 of FIG. 1. In detail, the support wafer 180 forms the substrate 11.

The methods described herein may be extended for manufacturing, from the wafer 150, the arm 101 and the blocking structure 102 of the optical shutter 100.

Finally, it is clear that modifications and variations may be made to the actuator 10, the optical shutter 100, and the manufacturing method described and illustrated herein, without thereby departing from the scope of this disclosure, as defined in the annexed claims.

For instance, the windings of the peripheral portion of the main body formed by the layered structure may be spaced apart by a variable distance, for example to form a logarithmic spiral. However, a variable distance between the windings may involve the use of a greater area of material given the same performance of the MEMS angular actuator.

For instance, the number of windings, the size of the windings, the number of deformable units, the number of actuation elements and the thickness of each layer of the stack of layers may be modified and chosen based on the desired mechanical properties of the MEMS angular actuator.

For instance, the stiffening structures may extend, starting outwardly from the corresponding portion of the support structure, i.e., moving away from the central portion of the main body so that the cavities and the lateral openings of the deformable units are oriented outwardly and not toward the central portion of the main body.

For instance, the actuation elements may extend partially on the portion of the support structure and/or at least part of the pair of stiffening structures of each deformable unit.

For instance, each deformable unit may have a respective pair of stiffening structures distinct from the pair of stiffening structures of an adjacent deformable unit.

For instance, the arm of the shutter may be constrained to any stiffening structure or portion of support structure of any deformable unit.

It will moreover be evident to the person skilled in the art that the peripheral portion of the central body may have portions, for small values of the angular coordinate θ and therefore in the proximity of the central portion of the main body, which have shapes and dimensions that differ from the shapes and dimensions of corresponding portions for higher values of the angular coordinate θ, on account of specific manufacturing requirements.

The invention claimed is:

1. A microelectromechanical (MEMS) actuator, comprising:
a main body including a central portion couplable to a substrate and a peripheral portion, wherein the peripheral portion, when said central portion is coupled to said substrate, is suspended over the substrate, and wherein the peripheral portion comprises a deformable structure that extends around the central portion and forms a plurality of membranes arranged in succession, the peripheral portion having a spiral planar shape when at rest; and
a plurality of bearing structures, each bearing structure being fixed at its top to the deformable structure and laterally delimiting a corresponding cavity, the corresponding cavity having a lateral opening facing the central portion of the main body and being closed at its top by a corresponding membrane, said corresponding membrane comprising a fixed part affixed to the underlying bearing structure and a suspended part, the suspended part being laterally offset with respect to the underlying bearing structure and delimiting said lateral opening of the cavity;
each bearing structure having a corresponding piezoelectric actuator associated therewith; and
wherein the piezoelectric actuators are electrically controllable so as to cause deformation of the corresponding membranes, the deformation comprising an upward curving of portions of the suspended parts, the upward curving of the portions of the suspended parts of the membranes causing a rotation of the bearing structures around the central portion of the main body.

2. The MEMS actuator according to claim 1, further comprising a support structure having a spiral shape and extending underneath the deformable structure; and wherein each bearing structure comprises:
a corresponding portion of the support structure; and
a pair of stiffening structures which, at rest, extend from corresponding ends of the corresponding portion of the support structure along corresponding radial directions toward the central portion of the main body;
wherein the fixed part of each membrane is fixed to a corresponding pair of stiffening structures and to the corresponding portion of the support structure; and
wherein the upward curving of the portions of the suspended parts of the membranes causes an increase of curvature of each portion of the support structure, with consequent increase of angular extension of the support structure and rototranslation of the stiffening structures, said rototranslation comprising a rotation around the central portion of the main body.

3. The MEMS actuator according to claim 2, wherein each stiffening structure has a first end that is integral with the corresponding portion of the support structure and a second end; and wherein the suspended part of each membrane comprises a respective edge that extends between the second ends of corresponding stiffening structures and overlies a corresponding lateral opening which is laterally delimited by the second ends of the corresponding stiffening structures; and wherein the upward curving of the portion of the suspended part of each membrane causes a curving upward of the corresponding edge, with concavity facing downwardly.

4. The MEMS actuator according to claim 3, wherein the membranes have a dimension along the radial direction that is angularly invariant.

5. The MEMS actuator according to claim 3, wherein at least part of the support structure has a dimension along the radial direction that is angularly invariant.

6. The MEMS actuator according to claim 2, wherein the deformable structure has a thickness smaller than a thickness of the stiffening structures and smaller than a thickness of the support structure.

7. The MEMS actuator according to claim 1, wherein each piezoelectric actuator comprises a piezoelectric region which extends over the suspended part of the corresponding membrane.

8. An optical shutter, comprising:
a MEMS actuator comprising:
a main body including a central portion couplable to a substrate and a peripheral portion, wherein the peripheral portion, when said central portion is coupled to said substrate, is suspended over the substrate, and wherein the peripheral portion comprises a deformable structure that extends around the central portion and forms a plurality of membranes arranged in succession, the peripheral portion having a spiral planar shape when at rest;
a plurality of bearing structures, each bearing structure being fixed at its top to the deformable structure and laterally delimiting a corresponding cavity, the corresponding cavity having a lateral opening facing the central portion of the main body and being closed at its top by a corresponding membrane, said corresponding membrane comprising a fixed part affixed to the underlying bearing structure and a suspended part, the suspended part being laterally offset with respect to the underlying bearing structure and delimiting said lateral opening of the cavity;
each bearing structure having a corresponding piezoelectric actuator associated therewith;
wherein the piezoelectric actuators are electrically controllable so as to cause deformation of the corresponding membranes, the deformation comprising an upward curving of portions of the suspended parts, the curving of the portions of the suspended parts of the membranes causing a rotation of the bearing structures around the central portion of the main body;
an arm having a first end and a second end, the first end being constrained to one of said bearing structures; and
a blocking structure constrained to the second end of the arm and configured to reflect or absorb electromagnetic radiation.

9. The optical shutter according to claim 8, wherein said arm is constrained to the bearing structure which is most distant from said central portion of the main body.

10. The optical shutter according to claim 8, further comprising a support structure having a spiral shape and extending underneath the deformable structure; and wherein each bearing structure comprises:
a corresponding portion of the support structure; and
a pair of stiffening structures which, at rest, extend from corresponding ends of the corresponding portion of the support structure along corresponding radial directions toward the central portion of the main body;
wherein the fixed part of each membrane is fixed to a corresponding pair of stiffening structures and to the corresponding portion of the support structure; and
wherein the upward curving of the portions of the suspended parts of the membranes causes an increase of curvature of each portion of the support structure, with consequent increase of angular extension of the support structure and rototranslation of the stiffening structures, said rototranslation comprising a rotation around the central portion of the main body.

11. The optical shutter according to claim 10, wherein each stiffening structure has a first end that is integral with the corresponding portion of the support structure and a second end; and wherein the suspended part of each membrane comprises a respective edge that extends between the second ends of corresponding stiffening structures and overlies a corresponding lateral opening which is laterally delimited by the second ends of the corresponding stiffening structures; and wherein the upward curving of the portion of the suspended part of each membrane causes a curving upward of the corresponding edge, with concavity facing downwardly.

12. The optical shutter according to claim 11, wherein the membranes have a dimension along the radial direction that is angularly invariant.

13. The optical shutter according to claim 11, wherein at least part of the support structure has a dimension along the radial direction that is angularly invariant.

14. The optical shutter according to claim 10, wherein the deformable structure has a thickness smaller than a thickness of the stiffening structures and smaller than a thickness of the support structure.

15. The optical shutter according to claim 8, wherein each piezoelectric actuator comprises a piezoelectric region which extends over the suspended part of the corresponding membrane.

16. A system, comprising:
an optical shutter comprising:
a MEMS actuator comprising:
a main body including a central portion couplable to a substrate and a peripheral portion, wherein the peripheral portion, when said central portion is coupled to said substrate, is suspended over the substrate, and wherein the peripheral portion comprises a deformable structure that extends around the central portion and forms a plurality of membranes arranged in succession, the peripheral portion having a spiral planar shape when at rest;
a plurality of bearing structures, each bearing structure being fixed at its top to the deformable structure and laterally delimiting a corresponding cavity, the corresponding cavity having a lateral opening facing the central portion of the main body and being closed at its top by a corresponding membrane, said corresponding membrane comprising a fixed part affixed to the underlying bearing structure and a suspended part, the suspended part being laterally offset with respect to the underlying bearing structure and delimiting said lateral opening of the cavity;
each bearing structure having a corresponding piezoelectric actuator associated therewith;
wherein the piezoelectric actuators are electrically controllable so as to cause deformation of the corresponding membranes, the deformation comprising an upward curving of portions of the suspended parts, the curving of the portions of the suspended parts of the membranes causing a rotation of the bearing structures around the central portion of the main body;
an arm having a first end and a second end, the first end being constrained to one of said bearing structures; and a blocking structure constrained to the second end of the arm and configured to reflect or absorb electromagnetic radiation; and an optical source configured to generate an optical beam;

wherein the optical shutter is configured to operate alternatively in:
- a first operating condition where said optical beam impinges upon said blocking structure; and
- a second operating condition where said optical beam is at least partially offset laterally with respect to the blocking structure.

17. The system according to claim 16, wherein said arm is constrained to the bearing structure which is most distant from said central portion of the main body.

18. The system according to claim 16, further comprising a support structure having a spiral shape and extending underneath the deformable structure; and wherein each bearing structure comprises:
- a corresponding portion of the support structure; and
- a pair of stiffening structures which, at rest, extend from corresponding ends of the corresponding portion of the support structure along corresponding radial directions toward the central portion of the main body;

wherein the fixed part of each membrane is fixed to a corresponding pair of stiffening structures and to the corresponding portion of the support structure; and wherein the upward curving of the portions of the suspended parts of the membranes causes an increase of curvature of each portion of the support structure, with consequent increase of angular extension of the support structure and rototranslation of the stiffening structures, said rototranslation comprising a rotation around the central portion of the main body.

19. The system according to claim 18, wherein each stiffening structure has a first end that is integral with the corresponding portion of the support structure and a second end; and wherein the suspended part of each membrane comprises a respective edge that extends between the second ends of corresponding stiffening structures and overlies a corresponding lateral opening that is laterally delimited by the second ends of the corresponding stiffening structures; and wherein the upward curving of the portion of the suspended part of each membrane causes a curving upward of the corresponding edge, with concavity facing downwardly.

20. The system according to claim 19, wherein the membranes have a dimension along the radial direction that is angularly invariant.

21. The system according to claim 19, wherein at least part of the support structure has a dimension along the radial direction that is angularly invariant.

22. The system according to claim 18, wherein the deformable structure has a thickness smaller than a thickness of the stiffening structures and smaller than a thickness of the support structure.

23. The system according to claim 16, wherein each piezoelectric actuator comprises a piezoelectric region which extends over the suspended part of the corresponding membrane.

24. A method for manufacturing a MEMS actuator, comprising:
forming a main body including a central portion that is couplable to a substrate and a peripheral portion that, when said central portion is coupled to said substrate, is suspended over the substrate and comprises a deformable structure, wherein the deformable structure extends around the central portion and forms a plurality of membranes arranged in succession, the deformable structure having a spiral planar shape at rest;

forming a plurality of bearing structures, each bearing structure being fixed at its top to the deformable structure and laterally delimiting a corresponding cavity, the corresponding cavity having a lateral opening facing the central portion of the main body and being closed at its top by a corresponding membrane, said corresponding membrane comprising a fixed part affixed to the underlying bearing structure and a suspended part, the suspended part being laterally offset with respect to the underlying bearing structure and delimiting said lateral opening of the cavity; and for each bearing structure, forming a corresponding piezoelectric actuator, each piezoelectric actuator being electrically controllable so as to cause a deformation of the corresponding membrane, the deformation comprising an upward curving of a portion of the suspended part, the upward curving of the portion of the suspended part of the membranes causing a rotation of the corresponding bearing structure around the central portion of the main body.

25. The method according to claim 24, further comprising:
forming a support structure to have a spiral shape and extend underneath the deformable structure; and
wherein forming the plurality of bearing structures comprises:
forming each bearing structure so as to include a corresponding portion of the support structure; and
for each bearing structure, forming a pair of stiffening structures that, at rest, extend from corresponding ends of the corresponding portion of the support structure along corresponding radial directions toward the central portion of the main body;
wherein said forming of the main body is such that the fixed part of each membrane is affixed to the corresponding pair of stiffening structures and to the corresponding portion of the support structure, so that the curving of the portions of the suspended parts of the membranes causes an increase of the curvature of each portion of the support structure, with consequent increase of angular extension of the support structure and rototranslation of the stiffening structures, said rototranslation comprising a rotation around the central portion of the main body.

26. The method according to claim 25, wherein forming the main body comprises:
forming a multilayer dielectric structure on a semiconductor substrate delimited by a front surface and by a rear face;
subsequently forming the piezoelectric actuators on the multilayer dielectric structure; and
selectively removing portions of the multilayer dielectric structure laterally offset with respect to said piezoelectric actuators, so as to form a trench having a spiral shape, the trench facing the semiconductor substrate and laterally delimiting said deformable structure;
wherein forming the plurality of bearing structures comprises selectively removing portions of the semiconductor substrate, from the rear face, so that said cavities communicate with the trench.

27. The method according to claim 26, further comprising:
after selectively removing portions of the semiconductor substrate, fixing the central portion of the main body to a semiconductor wafer so that the peripheral portion of the main body is suspended over the semiconductor wafer.

\* \* \* \* \*